(12) United States Patent
Coutu, Jr. et al.

(10) Patent No.: US 10,427,934 B1
(45) Date of Patent: Oct. 1, 2019

(54) THERMAL MANAGEMENT USING MICROELECTROMECHANICAL SYSTEMS BIMORPH CANTILEVER BEAMS

(71) Applicant: Government of the United States as represented by the Secretary of the Air Force, Wright-Patterson AFB, OH (US)

(72) Inventors: Ronald A Coutu, Jr., Milwaukee, WI (US); Robert S LaFleur, Fairborn, OH (US); John P. K. Walton, Troy, OH (US); LaVern A Starman, Dayton, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 0 days.

(21) Appl. No.: 15/662,810

(22) Filed: Jul. 28, 2017

Related U.S. Application Data

(60) Provisional application No. 62/475,501, filed on Mar. 23, 2017.

(51) Int. Cl.
*H05K 7/20* (2006.01)
*B81B 3/00* (2006.01)
(Continued)

(52) U.S. Cl.
CPC ............ *B81B 7/0087* (2013.01); *B81B 3/007* (2013.01); *F03G 7/06* (2013.01); *B81B 2201/032* (2013.01)

(58) Field of Classification Search
CPC . B81B 7/0087; B81B 3/007; B81B 2201/032; F03G 7/06
(Continued)

(56) References Cited

U.S. PATENT DOCUMENTS

| 2,949,283 | A | * | 8/1960 | Smith | ............... | F28F 1/12 |
| | | | | | | 165/180 |
| 3,489,203 | A | * | 1/1970 | Fischell | ............... | B64G 1/506 |
| | | | | | | 165/104.26 |

(Continued)

OTHER PUBLICATIONS

Coutu et al., "Thermal Management Using MEMS Bimorph Cantilever Beams," Experimental Mechanics, Sep. 2016, vol. 56, Issue 7, pp. 1293-1303, First Online: May 18, 2016.
(Continued)

*Primary Examiner* — Anatoly Vortman
(74) *Attorney, Agent, or Firm* — Matthew Fair; AFMCLO/JAZ

(57) ABSTRACT

A cooling structure for a heat source, where the cooling structure includes a beam having a first end and a second end and a length disposed therebetween. The beam is formed at least in part of a first material having a first thermal coefficient of expansion and a second material having a second thermal coefficient of expansion, where the first thermal coefficient of expansion is different from the second thermal coefficient of expansion. The first end of the beam is thermally connected to the heat source, such that heat generated by the heat source is conducted along the length of the beam to the second end of the beam. The heat conducted through the beam causes the beam to deflect as the first and second materials expand differently due to the difference in the first and second thermal coefficients of expansion.

13 Claims, 1 Drawing Sheet

(51) Int. Cl.
*F03G 7/06* (2006.01)
*B81B 7/00* (2006.01)
(58) Field of Classification Search
USPC .......................................................... 361/722
See application file for complete search history.

(56) References Cited

U.S. PATENT DOCUMENTS

| | | | | |
|---|---|---|---|---|
| 4,032,071 A * | 6/1977 | Imoto | .................... | G05D 23/08 |
| | | | | 137/468 |
| 4,423,401 A * | 12/1983 | Mueller | ................ | B81B 3/0086 |
| | | | | 337/107 |
| 5,875,096 A * | 2/1999 | Gates | ..................... | H01L 23/10 |
| | | | | 165/80.3 |
| 6,278,607 B1 * | 8/2001 | Moore | .................... | G06F 1/203 |
| | | | | 361/679.54 |
| 6,333,772 B1 * | 12/2001 | Mori | ................. | G02F 1/133382 |
| | | | | 349/161 |
| 6,608,752 B2 * | 8/2003 | Morris | .................... | H01L 23/34 |
| | | | | 165/104.33 |
| 6,900,510 B2 * | 5/2005 | Tamura | ................. | B81B 3/0051 |
| | | | | 257/254 |
| 8,217,558 B2 * | 7/2012 | Bancken | ............... | H01L 33/483 |
| | | | | 236/101 R |
| 8,339,787 B2 * | 12/2012 | Tsai | ........................ | G06F 1/206 |
| | | | | 165/104.33 |
| 9,025,333 B1 * | 5/2015 | Spowart | .................. | F28F 13/00 |
| | | | | 165/276 |
| 9,080,820 B2 * | 7/2015 | Bolton | .................... | F28F 13/00 |
| 9,587,632 B2 * | 3/2017 | Dimascio | .................. | F03G 7/06 |
| 2003/0085659 A1 * | 5/2003 | Overmann | ........ | G02F 1/133385 |
| | | | | 315/32 |
| 2007/0205473 A1 * | 9/2007 | Youngner | ............. | B81B 7/0087 |
| | | | | 257/414 |
| 2009/0218087 A1 * | 9/2009 | Oshima | .................... | C09K 5/14 |
| | | | | 165/185 |
| 2009/0321044 A1 * | 12/2009 | Hernon | ................... | H01L 23/34 |
| | | | | 165/80.2 |

OTHER PUBLICATIONS

Cho, "Design, Fabrication, and Characterization of a MEMS Thermal Switch and Integration With a Dynamic Micro Heat Engine," Washington State University, School of Mechanical and Materials Engineering, Dec. 2007.

Zhou F, Arunasalam P, Murray BT, Sammakia B (2010) Modeling heat transport in thermal interface materials enhanced with MEMS-based microinterconnects. IEEE Trans Compon Packag Technol 33(1):16-24.

Bazaei A, Fowler AG, Moheimani SOR (2012) Improved electro-thermal position sensing in MEMS with non-uniformly shaped heaters. IEEE.

Hildenbrand J, Korvink J, Wollenstein J, Peter C, Kürzinger A, Naumann F, Ebert M, Lamprecht F (2010) Micromachined mid-infrared emitter for fast transient temperature operation for optical gas sensing systems. IEEE Sensors J 10(2).

Pal S, Samuelson SR, Zhang X, Xie H (2013) Large in-plane displacement microactuators based on electro-thermal bimorphs with folded multiple segments. IEEE Transducers 2013, Barcelona, Spain.

Li M-H, Li C-S, Chin C-H, Chen C-Y, Li S-S (2013) An ultra-low power ovenized CMOS-MEMS resonator monolithically integrated with interface circuits. IEEE MEMS 2013, Taipei, Taiwan.

Roman CT, Starman LA, Coutu RA Jr (2010) Thermal management and metamaterials. Proceedings of the SEM Annual Conference, The 11th International Symposium on MEMS and Nanotechnology, vol. 2. Indianapolis, IN, p. 215-222.

Siegele M, Gamauf C, Nemecek A, Mutinati GC, Steinhauer S, Köck A, Kraft J, Siegert J, Schrank F (2013) Optimized integrated micro-hotplates in CMOS technology. IEEE.

Coutu RA, Ostrow SA (2013) Microelectromechanical systems (MEMS) resistive heaters as circuit protection devices. IEEE Trans Compon Packag Manuf Technol 3(12):2174-2179.

Boyer L (2001) Contact resistance calculations: generalizations of Greenwood's formula including interface films. IEEE Trans Compon Packag Technol 24:50-58.

* cited by examiner

# THERMAL MANAGEMENT USING MICROELECTROMECHANICAL SYSTEMS BIMORPH CANTILEVER BEAMS

PRIORITY CLAIM

This application claims rights and priority on prior U.S. provisional patent application Ser. No. 62/475,501 filed 2017 Mar. 23, the entirety of the disclosure of which is included herein by reference.

GOVERNMENT INTEREST

The invention described herein may be manufactured, used, and licensed by or for the Government of the United States for all governmental purposes without the payment of any royalty.

FIELD

This invention relates to the field of microelectronics. More particularly, this invention relates to passive thermal management structures for microelectronics.

BACKGROUND

As the feature sizes of microelectronic devices shrink, cooling issues become increasingly important. This is compounded by the fact that most devices are operating at ever-increasing speeds, and thus produce heat at an even greater rate than prior generations. Thus, modern devices produce more heat in smaller spaces that ever before.

Unfortunately, as the heat builds up within a microelectronic device, it tends to change the physical properties of the device. This tends to change the electrical characteristics of the device, often making it at least unreliable for its intended purpose, and in many instances, rendering the device wholly nonfunctional. Thus, there is a constant and growing need for means and methods by which heat can be removed from microelectronic devices.

Maintaining an ideal operating temperature for microelectronic devices is commonly achieved with heat sinks and air movement, which regulate temperature through a combination of thermal conduction and forced convection. This approach often requires additional components, such as a cooling fan that increases system size, weight and power requirements.

Alternate cooling techniques, such as low temperature co-fired ceramic structures, electrowetting-on-dielectric, liquid film cooling, variable thermal resistors, microjects, microchannel coolers, and thermoacoustic-based cooling have been employed, but none are universally applicable.

Additional impediments to cooling of microelectronic devices using some of these techniques are often imposed because of device packaging and encapsulation. Most of the techniques do not address localized hotspots within microelectronic devices or selective cooling of specific components therein without requiring active control or forced convection.

What is needed, therefore, is a cooling system that tends to reduce issues such as those described above, at least in part.

SUMMARY

The above and other needs are met by a cooling structure for a heat source, where the cooling structure includes a beam having a first end and a second end and a length disposed therebetween. The beam is formed at least in part of a first material having a first thermal coefficient of expansion and a second material having a second thermal coefficient of expansion, where the first thermal coefficient of expansion is different from the second thermal coefficient of expansion. The first end of the beam is thermally connected to the heat source, such that heat generated by the heat source is conducted along the length of the beam to the second end of the beam. The heat conducted through the beam causes the beam to deflect as the first and second materials expand differently due to the difference in the first and second thermal coefficients of expansion. Characteristics of the beam are selected such that the second end of the beam makes thermal contact with a heat sink as a temperature of the heat source increases. The beam thereby conducts heat away from the heat source to the heat sink and assists to lower the temperature of the heat source.

In some embodiments according to this aspect of the invention, the characteristics of the beam include the first and second thermal coefficients of expansion. In some embodiments, the characteristics of the beam include the length of the beam. In some embodiments, the characteristics of the beam include a thickness of the beam. In some embodiments, the characteristics of the beam include a relative thickness of the first and second materials. In some embodiments, the second end of the beam makes thermal contact with the heat sink when the heat source has been at a desired temperature for a desired length of time.

In some embodiments, the beam comprises a plurality of beams, and a first subset of the beams have a first characteristic and a second subset of the beams have a second characteristic that is different from the first characteristic, where the different characteristics cause the first subset of the beams to make contact with the heat sink under different conditions than the second subset of the beams makes contact with the heat sink.

In some embodiments, the different characteristics include the first and second thermal coefficients of expansion. In some embodiments, the different characteristics include the length of the beams. In some embodiments, the different characteristics include a thickness of the beams. In some embodiments, the different characteristics include a relative thickness of the first and second materials. In some embodiments, the heat source is an integrated circuit. In some embodiments, the heat source, beam, and heat sink are formed using microphotolithographic processes.

According to another aspect of the invention there is described a cooling structure for a heat source, where the cooling structure includes a plurality of beams. Each beam has a first end and a second end and a length disposed therebetween, and is formed at least in part of a first material having a first thermal coefficient of expansion and a second material having a second thermal coefficient of expansion, where the first thermal coefficient of expansion is different from the second thermal coefficient of expansion. The first end of each beam is thermally connected to the heat source, such that heat generated by the heat source is conducted along the lengths of the beams to the second ends of the beams. The heat conducted through the beams causes the beams to deflect as the first and second materials expand differently due to the differences in the first and second thermal coefficients of expansion. Characteristics of the beams are selected such that the second ends of the beams make thermal contact with at least one heat sink as a temperature of the heat source increases. The beams thereby conduct heat away from the heat source to the heat sink.

In some embodiments according to this aspect of the invention, the characteristics of the beams include the first and second thermal coefficients of expansion. In some embodiments, the characteristics of the beams include the length of the beams. In some embodiments, the characteristics of the beams include a thickness of the beams. In some embodiments, the characteristics of the beams include a relative thickness of the first and second materials. In some embodiments, a first subset of the beams have a first characteristic and a second subset of the beams have a second characteristic that is different from the first characteristic, where the different characteristics cause the first subset of the beams to make contact with the heat sink under different conditions than the second subset of the beams makes contact with the heat sink According to yet another aspect of the invention there is described a method of forming a cooling structure for a heat source. A beam is formed, having a first end and a second end and a length disposed therebetween. The beam is formed at least in part of a first material having a first thermal coefficient of expansion and a second material having a second thermal coefficient of expansion, where the first thermal coefficient of expansion is different from the second thermal coefficient of expansion. The first end of the beam is thermally connected to the heat source, such that heat generated by the heat source is conducted along the length of the beam to the second end of the beam. The heat conducted through the beam causes the beam to deflect as the first and second materials expand differently due to the difference in the first and second thermal coefficients of expansion. Characteristics of the beam are selected such that the second end of the beam makes thermal contact with a heat sink as a temperature of the heat source increases. The beam thereby conducts heat away from the heat source to the heat sink and assists to lower the temperature of the heat source.

DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
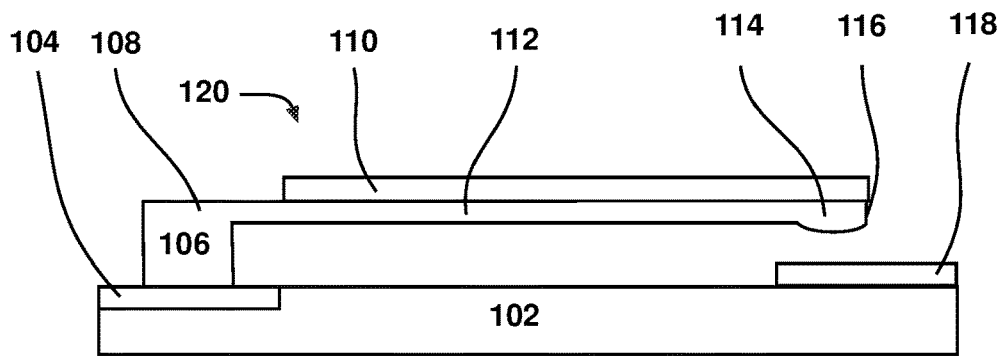
FIG. 1 is a side view of a cooling beam according to an embodiment of the invention, where the second end of the beam does not make physical contact with another structure.

With reference now to FIG. 1, there is depicted a circuit 100 having a beam 120 according to an embodiment of the present invention. The circuit 100 is formed in or on a substrate 102, which in various embodiments could be one or more of silicon, gallium arsenide, sapphire, or some other material. The circuit 100 includes a portion 104 that produces heat during operation. This heat source 104 can be formed, in various embodiments, either in or on top of the substrate 102.

An extension 106 extends upward (in the orientation as depicted) from the heat source 104 and the substrate 102. In some embodiments, the circuit that comprises the heat source 104 comprises some or all of the extension 106. The extension 106 is connected to the first end 108 of the beam 120, which extends along a length of the beam 120 to the second end 114 of the beam 120. A connecting pad 116 is optionally included in some embodiments of the circuit 100.

The beam 120 is formed of at least two materials, 110 and 112, which have differing coefficients of thermal expansion. Thus, as the temperature of the beam 120 changes, the deflection of the second end of the beam 114 will also change, either toward or away from the heat sink 118 that is formed either on or in the substrate 102. In the embodiment as depicted, the beam 120 is flat and level, but in some embodiments the beam 120 will have an upward curl to it at room temperature. In other embodiments, the beam 120 will have a slight downward curl to it at room temperature, but will not contact the heat sink 118.

The purpose of the beam 120 is to conduct heat away from the heat producing circuit 104 and to the heat sink 118, thus assisting to cool the heat source 104. To this end, the materials from which the extension 106 and beam 120 are formed are selected so as to have thermal conductivity properties that are sufficient to conduct a desired amount of heat away from the circuit 104 and to the heat sink 118. Further, the materials of the extension 106, or any layers disposed between the extension 106 and the circuit 104, are selected such that the electrical properties of the extension 106 do not interfere with the electrical operation of the circuit 104.

Figure 2:
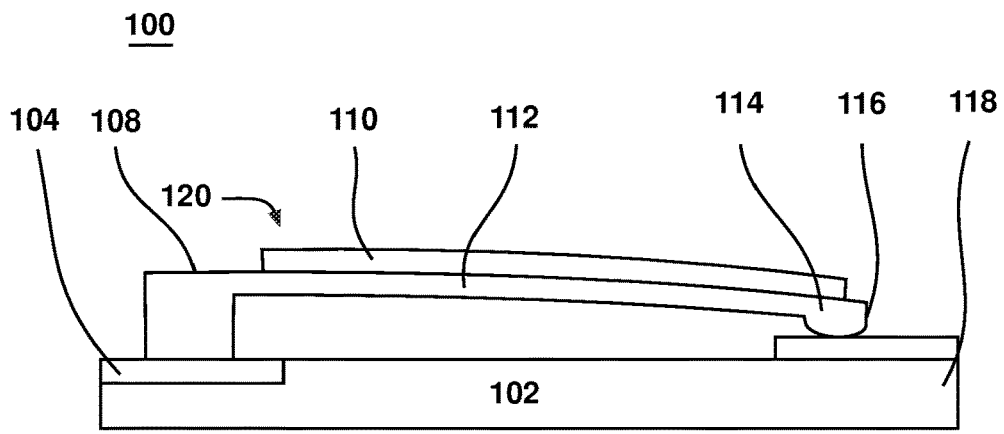
FIG. 2 is a side view of a cooling beam according to an embodiment of the invention, where the second end of the beam makes physical contact with another structure.

With reference now to FIG. 2, there is depicted a beam 120 that is deflected toward the substrate 102, such that the deflected second end 114 of the beam 120 has brought the contact pad 116 into physical contact with the heat sink 118. This condition would occur, for example, when the circuit 104 is producing heat, and the beam 120 has absorbed a sufficient amount of heat such that the forces between the first material 110, which has a relatively higher thermal coefficient of expansion, and the second material 112, which has a relatively lower thermal coefficient of expansion, are sufficient to deflect the beam 120.

In this configuration, the beam 120 has created a thermal pathway between the circuit 104 and the heat sink 118, which thermal pathway assists in cooling the circuit 104. In the configuration of FIG. 1, by contrast, the beam 120 might absorb some amount of heat from the circuit 104, but if that amount of heat is insufficient to deflect the beam 120 into contact with the heat sink 118, then at some point the beam 120 will equilibrate and absorb no more heat from the circuit 104, except for that small amount which it might be able to radiate.

Thus, the beam 120 according to embodiments of the present invention provides a way to passively cool the circuit 104, meaning that no fan or other externally-applied cooling method is used. By selecting the physical characteristics of the beam 120, the amount of heat conducted away from the circuit 104, and the temperature at which the beam 120 deflects and provides the thermal pathway to the heat sink 118 can be controlled, so as to provide desired cooling effects to the circuit 104.

For example, the thickness of the beam 120, and the relative thicknesses of the materials 110 and 112 can be adjusted to produce either faster or slower deflection of the beam 120. Materials 110 and 112 with a greater difference in their thermal coefficients of expansion will deflect faster (and at a lower temperature) and farther than will materials 110 and 112 with less of a difference between their thermal coefficients of expansion. Wider beams 120 can absorb more heat before reaching temperatures that produce deflection, or might otherwise deflect more slowly than narrower beams. The length of a beam 120 from the first end 108 to the second end 114 can also effect the time that it takes the beam 120 to deflect, as described in more detail hereafter.

By adjusting the characteristics of the beam 120 using properties such as those described above, a circuit designer can design a beam 120 that will start to cool the heat source 104 after the heat source 104 has been at a given temperature for a given length of time.

EXAMPLE

Figure 3:
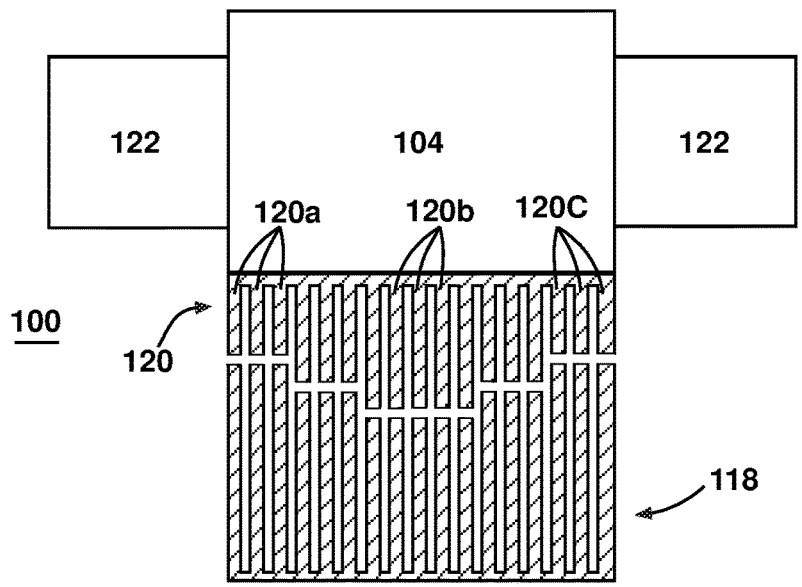
FIG. 3 is a top view of an electronic circuit including cooling beams according to an embodiment of the invention.

Two primary components were constructed in the test device 100 as described in this example and depicted in FIG. 3. The first was a resistor 104 with two electrical contact pads 122, and the second was a MEMS bimorph cantilever beam array, consisting of a plurality of beams 120, including a first plurality of beams 120a, a second plurality of beams 120b and a third plurality of beams 120c. The device 100 was fabricated using the PolyMUMPs™ process. This commercial surface micromachining process is composed of seven conformal layers, consisting of (1) a nitride layer deposited across the entire substrate 102 for electrical isolation, (2-4) three polysilicon mechanical layers, (5-6) two sacrificial oxide layers, (7) and a final metal layer Gold is deposited onto the second polysilicon layer in the PolyMUMPs™ process, so the beams 120 consisted of a gold layer 110 on top of a polysilicon layer 112. The thickness of the PolyMUMPs™ polysilicon layer 112 and the gold layer 110 are 1.5 µm and 0.5 µm, respectively, and the air gap between the beam 120 and the substrate 102 (or layers deposited thereon) as a result of the stacked oxide1 and oxide2 layers was 2.75 µm (prior to release of the beam 120 and its initial deflection). The width of the beams 120 was set to 30 µm so as to maximize the number of beams 120 connected to the resistance heater element 104, as well as to meet the PolyMUMPs™ design guidelines. The beams 120 were formed at different lengths to investigate differing deflections at a given temperature. In other embodiments, other characteristics of the beams 120 can be adjusted, so as to vary the deflection at a given temperature.

The resistor 104 was fabricated using a poly2 layer with anchored metal probe pads 122 on either side of the resistive element 104. The center area of the resistor 104 contained a trapped oxide to ensure that joule heating was contained in the polysilicon layer, resulting in a uniform heat distribution for actuating the beams 120. The trapped oxide also ensured that leakage currents, due to probing, flowed laterally away from the beams 120, not vertically into the substrate 102, which would tend to mask the operation of the beams 120. The heating element 104 generated heat from a combination of joule heating and power loss.

The beams 120 were fabricated using poly2 (1.5 µm-thick) and the final gold layer (0.5 µm-thick), resulting in a 2.0 µm-thick bimorph cantilever. At net-zero deflection (uncurled and flat) the beams 120 have a nominal 2.75 µm air gap defined by the PolyMUMPs™ process.

A 30 µm beam 120 width and spacing was used to isolate and characterize comparable beams 120. Therefore, the beam 120 length was the only variable altered during the experiment to validate its effect on thermal response. Additionally, a dimple was included near the free end of each beam to reduce stiction effects. Beams 120 with lengths of 200 µm, 250 µm, and 300 µm were formed. A fixed thermal observation array to act as a heat sink 118 was fabricated 15 µm away from the free end of the beams 120, to assist in analysis and characterizing overall heat transfers effects.

At room temperature, the released beams 120 curl upward due to residual stress that is incurred during the fabrication of the structure 100. In this case, the gold layer 110 was deposited at a temperature that was higher than room temperature. Specifically, the different coefficients of thermal expansion of gold and polysilicon create the compressive and tensile stresses in the beam 120 to create initial upward deflection (toward the gold layer 110) at room temperature, and subsequent downward deflection (toward the polysilicon layer 112) when heated during beam 120 operation.

The polysilicon resistor 104 exhibited a relatively hot middle section (590K) and relative cooler areas closer to the pads 122 (370K) with 5.0 V (~286 mA) applied. The applied voltage was chosen to simulate the temperatures typically observed in complementary metal oxide semiconductor device operation. The shape of the temperature distribution was symmetric, with the hot center area expanding outward with higher applied currents.

As the temperature of the heat source 104 increases, the beam experiences elevated temperatures at the fixed end, which in turn causes the beam to uncurl due to conduction. As the temperature of the heat source continues to rise, the beams 120 continue to deflect downward until contact is made with the substrate 102. Prior to making contact with the substrate 102, the deflecting beam 120 acts like a micro-pump for the small volume of air below and surrounding the beam 120. As the fluid volume is pushed away, the resulting initial convection quickly subsides, since a steady-state temperature is soon achieved after the beam 120 contacts the substrate 102. Once contact is established between the beam 120 and the substrate 102, conduction is the dominate heat transfer mechanism. As the temperature in the beam 120 increases, beyond the initial beam 120 contact temperature, the contact force increases and the thermal contact resistance decreases, resulting in higher thermal conduction.

Simulations showed all of the beams 120 curled upward at 27° C. (room temperature), and all of the beams 120 fully deflected and contacted the substrate 102 at 317° C. In some embodiments, the heat sink 118 would extend below the second end 114 of the beams 120, so as to improve thermal conduction, and would be formed of metal.

The longer (300 µm) beams 120 were positioned at the center of the heat source 104, to begin cooling the hottest areas first, while the shorter (200 µm), stiffer beams 120 were positioned closest to the contact pads 122. The longer beams 120 deflected soonest followed by the mid-sized (250 µm) beams 120, and then finally the shorter beams 120 at the edges of the heat source 104.

The longer beams 120 deflect quicker than the shorter beams 120, and thus in some embodiments are located closer to hotter components 104 to more quickly enable device 104 cooling. The length of the beams 120 can be application or electronic device specific. For example, low voltage and therefore cooler circuits 104 appear to be best cooled with shorter (200 µm) beams 120, while higher voltage and therefore hotter circuits appear to be best cooled with longer (300 µm) beams 120. However, these suggestions are when using the processes described above, and when other characteristics of the beams 120 can be adjusted, different beam 120 lengths might be useful for different temperature ranges.

The contact temperatures for the 200 µm, 250 µm, and 300

μm beams 120 in this example were approximately 231° C., 222° C., and 216° C., respectively with the longer beams 120 deflecting faster.

The foregoing description of embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

The invention claimed is:

1. A cooling structure for a heat source, the cooling structure comprising:
    a plurality of beams having a first end and terminating at a second end, the plurality of beams having a plurality of different lengths defined between the first and second ends, each beam formed at least in part of a first conducting material having a first thermal coefficient of expansion and a second conducting material having a second thermal coefficient of expansion, where the first thermal coefficient of expansion is different from the second thermal coefficient of expansion,
    the first end of each beam thermally connected to the heat source, such that heat generated by the heat source is conducted along the length of the beam to the second end of each beam,
    where the heat conducted through each beam causes each beam to deflect as the first and second materials expand differently due to the difference in the first and second thermal coefficients of expansion,
    where characteristics of each beam are selected such that the second end of each beam makes thermal contact with a heat sink as a temperature of the heat source increases, the beam thereby conducting heat away from the heat source to the heat sink and assisting to lower the temperature of the heat source;
    wherein the heat source and the heat sink are connected to a substrate and the beam extends across the substrate between the heat source and the heat sink; and
    wherein the plurality of beams include a first plurality of beams positioned at an intermediate location of the cooling structure, a second plurality beams and a third plurality of beams positioned on either side of the first plurality of beams, and wherein the second and third plurality of beams are shorter in length relative to the first plurality of beams.

2. The cooling structure of claim 1, wherein the characteristics of the beam include the first and second thermal coefficients of expansion.

3. The cooling structure of claim 1, wherein the characteristics of the beam include the length of the beam.

4. The cooling structure of claim 1, wherein the characteristics of the beam include a thickness of the beam.

5. The cooling structure of claim 1, wherein the characteristics of the beam include a relative thickness of the first and second materials.

6. The cooling structure of claim 1, wherein the second end of the beam makes thermal contact with the heat sink when the heat source has been at a desired temperature for a desired length of time.

7. The cooling structure of claim 1, wherein the plurality of beams includes a first subset of beams having a first characteristic and a second subset of beams having a second characteristic that is different from the first characteristic, where the different characteristics cause the first subset of beams to make contact with the heat sink under different conditions than the second subset of beams.

8. The cooling structure of claim 7, wherein the different characteristics include the first and second thermal coefficients of expansion.

9. The cooling structure of claim 7, wherein the different characteristics include a thickness of the beams.

10. The cooling structure of claim 7, wherein the different characteristics include a relative thickness of the first and second materials.

11. The cooling structure of claim 1, wherein the heat source is an integrated circuit.

12. The cooling structure of claim 1, wherein the heat source, beam, and heat sink are formed using microphotolithographic processes.

13. A method for cooling a cooling structure comprising:
    positioning a plurality of beams having a first end and terminating at a second end with varying lengths disposed therebetween, the beams formed at least in part of a first conducting material having a first thermal coefficient of expansion and a second conducting material having a second thermal coefficient of expansion, where the first thermal coefficient of expansion is different from the second thermal coefficient of expansion,
    wherein the plurality of beams include a first plurality of beams positioned at an intermediate location of the cooling structure, a second plurality beams and a third plurality of beams positioned on either side of the first plurality of beams, and wherein the second and third plurality of beams are shorter in length relative to the first plurality of beams,
    thermally contacting a heat source and a heat sink to a substrate;
    thermally connecting the first end of the each beam to the heat source, such that heat generated by the heat source is conducted along the length of each of the beams to the second end of each of the beams, and
    contacting the heat sink with the second end of each of the first, second and third plurality of beams at different predetermined temperatures of the heat source.

* * * * *